United States Patent
Trinh et al.

(10) Patent No.: US 9,516,780 B2
(45) Date of Patent: Dec. 6, 2016

(54) DEVICE FOR ACCOMMODATING MOUNTING RAIL MODULE CASES

(75) Inventors: Dat-Minh Trinh, Barntrup (DE); Heinrich Kaeuper, Paderborn (DE)

(73) Assignee: Phoenix Contact GmbH & Co. KG (DE)

( * ) Notice: Subject to any disclaimer, the term of this patent is extended or adjusted under 35 U.S.C. 154(b) by 809 days.

(21) Appl. No.: 13/876,875

(22) PCT Filed: Sep. 30, 2011

(86) PCT No.: PCT/EP2011/004883
§ 371 (c)(1),
(2), (4) Date: Jun. 27, 2013

(87) PCT Pub. No.: WO2012/041509
PCT Pub. Date: Apr. 5, 2012

(65) Prior Publication Data
US 2013/0294035 A1   Nov. 7, 2013

(30) Foreign Application Priority Data

Sep. 30, 2010 (DE) .................. 10 2010 046 990

(51) Int. Cl.
*H05K 7/16* (2006.01)
*H05K 7/14* (2006.01)

(52) U.S. Cl.
CPC .............. *H05K 7/16* (2013.01); *H05K 7/1464* (2013.01)

(58) Field of Classification Search
CPC ............. H05K 7/1441; H05K 7/1457; H05K 7/1474; H05K 7/1477; H05K 7/1478; H01R 4/64
USPC ....... 361/729, 788, 679.01, 679.02; 439/341, 439/338
See application file for complete search history.

(56) References Cited

U.S. PATENT DOCUMENTS 4,738,632 A *  4/1988  Schmidt .............. H05K 7/1441
                                                361/729
7,035,115 B2 *  4/2006  Walesa ................ H01R 25/164
                                                307/147

FOREIGN PATENT DOCUMENTS

| DE | 4421267 A1 | 1/1996 |
|---|---|---|
| DE | 102005032730 A1 | 1/2007 |
| EP | 0407241 A1 | 1/1991 |
| EP | 0599362 A2 | 6/1994 |
| EP | 1520330 B1 | 8/2008 |

OTHER PUBLICATIONS

Agnes Wittmann-Regis, "Related International Patent Application No. PCT/EP2011/004883 International Prelminary Report on Patentability", Apr. 11, 2013, Publisher: PCT, Published in: EP.
Kaluza, Andreas, "Related International Patent Application No. PCT/EP2011/004883 International Search Report", Feb. 14, 2012, Publisher: PCT, Published in: NL.
"Chinese Patent Application No. CN 2011 800 46213.2", "Office Action", Jan. 15, 2015, Publisher: SIPO, Published in: CN.
"German Office Action", issued in related patent application No. 10 2010 046 990.4, dated Jul. 14, 2011.

* cited by examiner

*Primary Examiner* — Anthony Haughton
(74) *Attorney, Agent, or Firm* — Kaplan Breyer Schwarz & Ottesen, LLP

(57) ABSTRACT

The invention relates to an accommodating device having a one-piece support that prevents damage to a circuit board and its contacts even with frequent installation and dismantling of mounting rail module cases. This is achieved in particular by the fact that the module case can be detached from an integral mounting rail of the support by pivoting it in the direction of the circuit board. This special pivoting is made possible by the fact that the integral mounting rail and the holding area of the circuit board are separated from one another spatially so that even in the installed state, the mounting rail module case and the circuit board are mechanically decoupled.

15 Claims, 3 Drawing Sheets

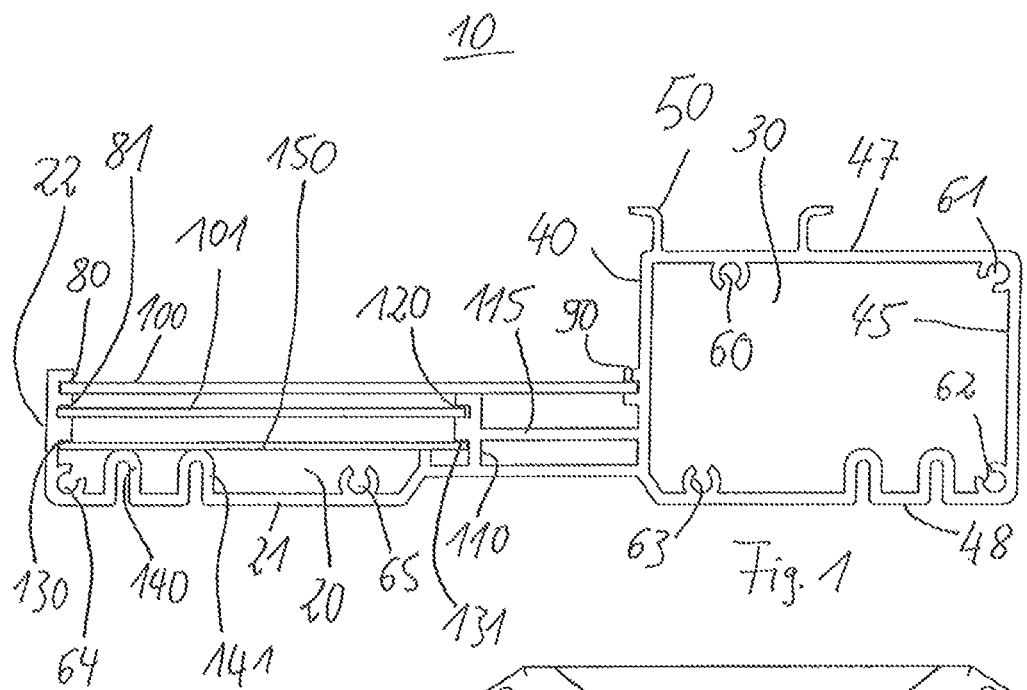
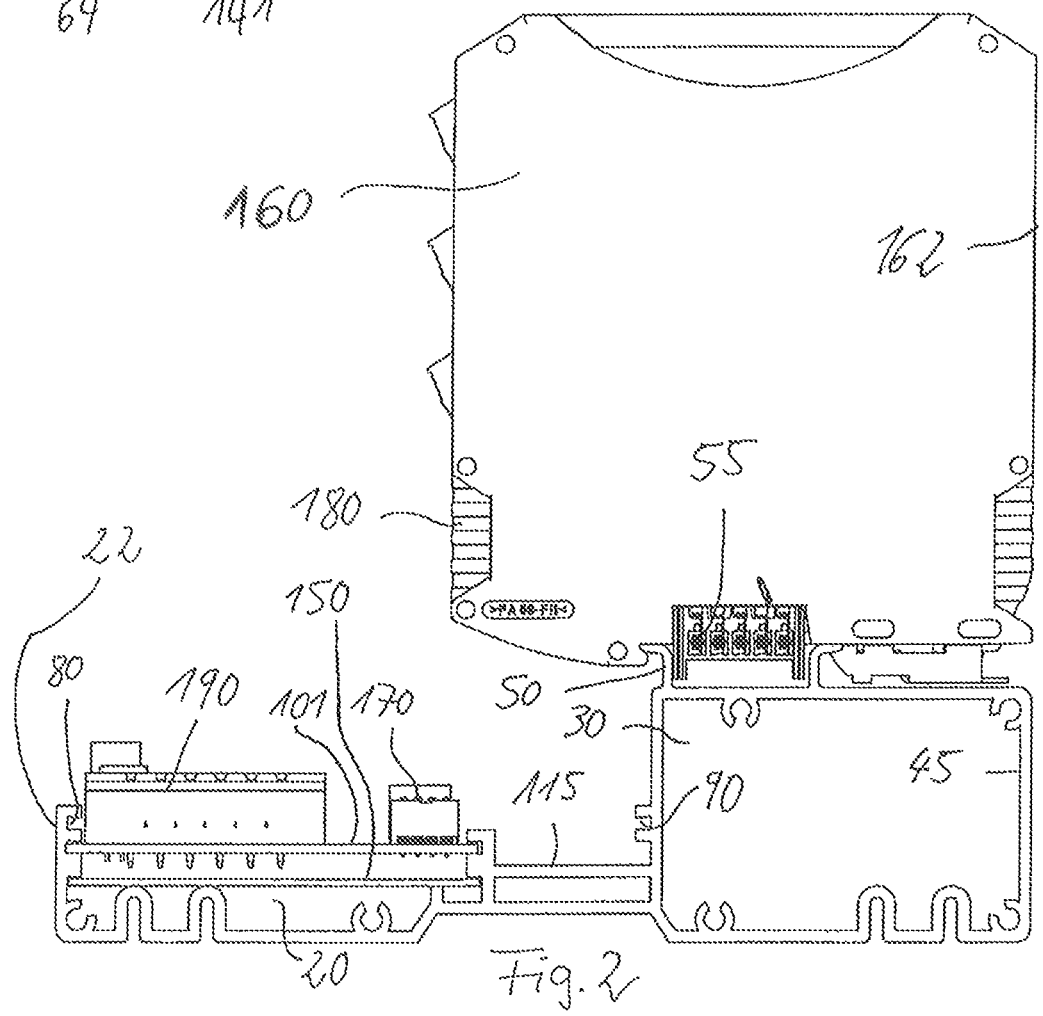

DEVICE FOR ACCOMMODATING MOUNTING RAIL MODULE CASES

FIELD OF THE INVENTION

The invention relates to a device for accommodating the mounting rail module cases, containing components that are to be electrically contacted.

BACKGROUND OF THE INVENTION

Electric and/or optoelectronic devices having a modular design that can be installed in control cabinets, for example, are used in automation technology. One such modular device is composed of several electric and/or optoelectronic components, which are accommodated in module cases. To obtain a compact design and simple wiring, the module cases are usually snapped onto and wired to a top hat rail side by side.

With the miniaturization of electronic circuits, the module cases have also become smaller. However, there has also been an increase in the electronic contact points at the same time. To cope with this development, there have been efforts to supply suitable supports for module cases.

One such support is known from EP 1 520 330 B1, for example. This support has two legs arranged at an angle to one another. A mounting rail on which the module cases can be mounted is provided on the first leg. In addition, on the first leg there is arranged a group of plug connectors that are paired with complementary contacts on the module case when a module case is snapped onto the mounting rail. A top hat rail mount is provided on the bottom side of the first leg to allow the support to be mounted on an external top hat rail. A circuit board having a plug connector strip is connected to the end face of the second leg by screws or by soldering. When a module case is snapped onto the rail, the plugs of the circuit board are connected to corresponding complementary contacts of the module case. The plug connectors of the first and second legs are arranged in such a way that contacting of the plug connectors does not interfere with the pivoting movements of the module case.

Because of the special shape of the support, it is only possible to use module cases of the same design, the same width and in a predetermined number, for example, 8 or 16 module cases. Furthermore, the contact strips on the module cases must always be arranged in the same areas in order to allow them to be paired with the plug connectors of the first and second legs.

SUMMARY OF THE INVENTION

The object of the present invention is to provide a device for accommodating mounting rail module cases such that it will be robust and low wear and will have a compact design. Furthermore, it can accommodate module cases of different dimensions. In particular, the module cases may vary in width and length and any desired number of them may be used. In addition, this device facilitates the installation and dismantling of circuit boards and mounting rail module cases.

A core idea of the invention is to be seen in a one-piece support which can prevent a circuit board and its contacts from being damaged even with frequent installation and dismantling of mounting rail module cases. This is achieved in particular by the fact that the module case can be released from an integral mounting rail of the support by pivoting it in the direction of the circuit board. This special pivoting is made possible by the fact that the integral mounting rail and the holding area of the circuit board are separated from one another in space, so that even in the mounted state the module case and the circuit board are mechanically decoupled. The integral mounting rail is thus decoupled from the circuit board.

Thus a device for accommodating mounting rail module cases containing components to be contacted electrically is provided. This device comprises a one-piece support, which has a first holding area for loosely holding a circuit board and a second holding area having an integrated mounting rail for holding at least one mounting rail module case. The first and second holding areas are arranged at a distance from one another so that the at least one module case can be released from the integral mounting rail by pivoting it in the direction of the circuit board.

This measure also makes it possible for the first holding area which holds the circuit board to be accessible for a maintenance person when the device is in the mounted state. This permits customer-friendly maintenance of the device. In the event of failure of a circuit board, it can be removed from the first holding area quickly and easily. It is also possible to replace a defective circuit board without having to remove the attached module cases.

The term "loosely holding a circuit board" means that the circuit board is not attached to the first holding area with separate fastening means such as screws, rivets or adhesive. The circuit board is held only by the specific shape of the first holding area.

Thanks to this measure a circuit board can be replaced quickly without any additional aids.

The defined space-saving pivoting direction of the module case is expediently achieved by the fact that the mounting rail module case is wired to the connecting contacts provided on the circuit board.

In this way, the module cases can be connected to a control unit quickly and without mistakes by means of prefabricated system cables having multipole plug connectors.

The circuit board is preferably a jumper card on which at least one plug connector strip is provided for connecting multiple module cases. In addition, multiple electronic circuits and/or optical or optoelectronic components may be arranged on the circuit board.

The mounting rail module cases can be connected to a higher-level control unit by means of the jumper card using prefabricated system cables and system connectors.

A flexible design of the device is achieved by the fact that the one-piece support has an extruded profile with an adjustable length.

To ensure that the device can be attached to a mounting rail, a side part may be detachably connected to each broad side of the support. Each side part has a holder by means of which the device can be achieved to a mounting rail. The device may thus be attached to any mounting rail simply by selecting the side parts with the complementary holders. The one-piece support need not be replaced to do so.

To be able to protect the side area of the support, the side part may extend over the entire width of the support. The side parts also prevent the circuit board from slipping out of the first holding area at the side. The side parts and the first holding area in this case hold the circuit board on all four sides.

The support advantageously has integral fastening contours for detachable fastening of the side parts.

The first holding area is designed so that it can hold multiple circuit boards loosely, even those of different dimensions.

To prevent an electric short circuit between the circuit board and the one-piece support, the first holding area may be designed for holding an insulating board loosely.

The first holding area advantageously has accommodating areas that are flush with one another for loosely accommodating the opposite longitudinal sides of the circuit board and/or the insulating board.

The accommodating areas advantageously have grooves.

To cover the module case and the cable harness connecting the circuit board to the module cases, a partition is provided, this partition being detachable from the device and separating at least one section of the first holding area from the second holding area.

The side parts are advantageously designed for guiding and holding the detachable partition.

According to one advantageous refinement, the integral mounting rail is in the form of a top hat rail. Traditional top hat rail module cases can thus be accommodated by this device in this way.

To be able to connect the mounting rail module cases to one another, to an external power source and/or to other electronic devices, a T-bus connector may be inserted into the integral mounting rail.

The accommodating device is thus suitable in particular for accommodating any number of different mounting rail module cases.

BRIEF DESCRIPTION OF THE DRAWINGS

The present invention is explained in greater detail below on the basis of an exemplary embodiment in combination with the accompanying drawings, in which FIG. 1 shows an extruded profile according to the invention in which two circuit boards of different sizes and one insulating board are held loosely;

FIG. 2 shows the extruded profile illustrated in FIG. 1, having a mounting rail module case, an assembled circuit board and an insulating board arranged thereon;

DETAILED DESCRIPTION

Figure 3:
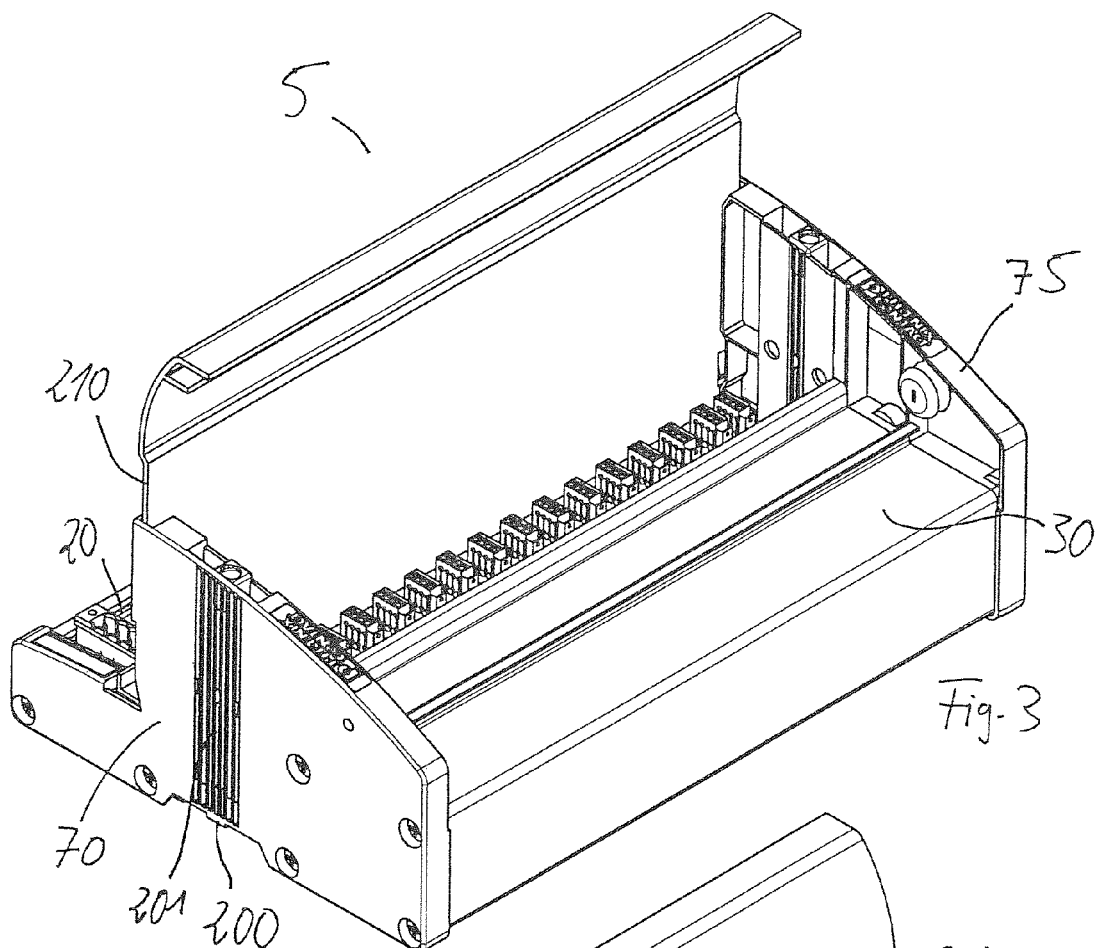
FIG. 3 shows a perspective view of an exemplary accommodating device having the extruded profile shown in FIG. 1, which is bordered by side parts.
Figure 4:
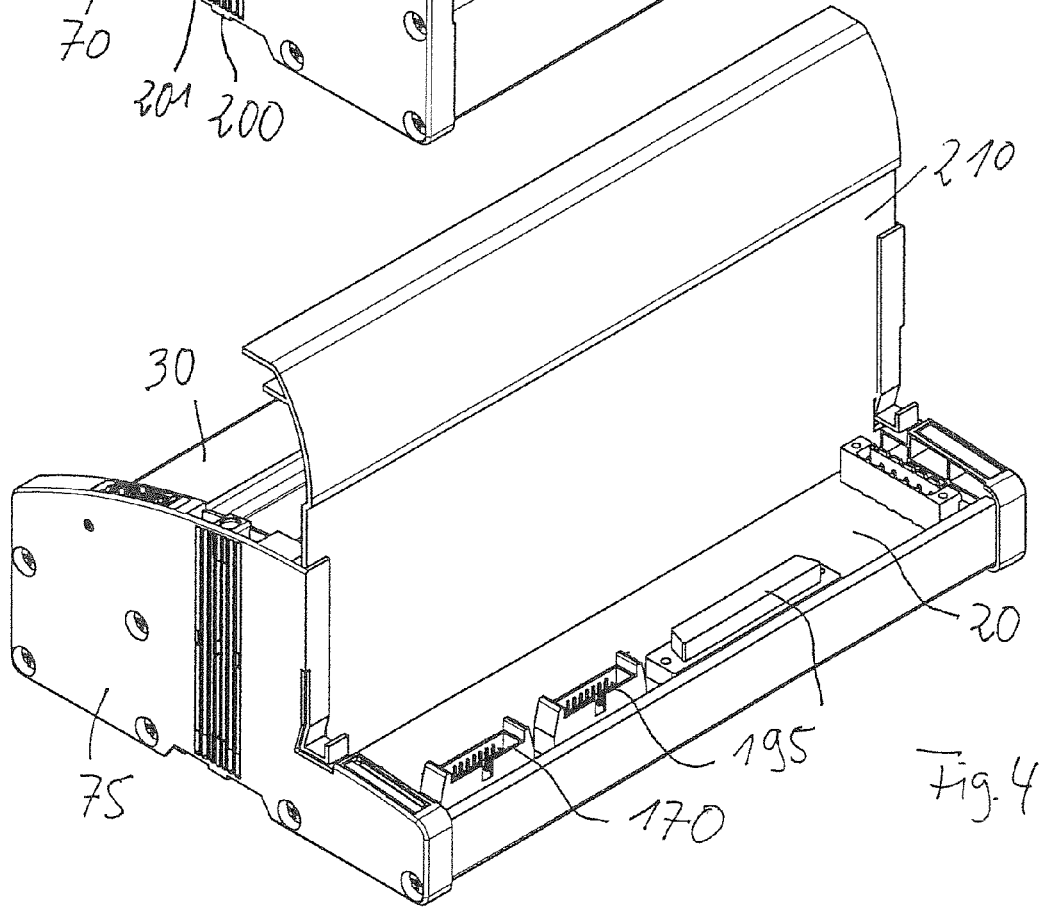
FIG. 4 shows a perspective view of the accommodating device shown in FIG. 3, which is rotated by 180° with respect to a vertical axis.

FIG. 1 shows an extruded profile 10 which functions as a one-piece support for an accommodating device 5 which is shown in FIG. 3. The one-piece support 10 may be produced from an extruded profile of any length, its lengths being freely selectable. FIG. 1 shows a side view of the one-piece support, which extends perpendicular to the plane of the page. The one-piece support 10 has a first holding area 20 and a second holding area 30. The holding area 30 may have an essentially rectangular cross section, which is defined by two opposing sides or walls 40 and 45, a top side 47 and a bottom side 48. An integral mounting rail 50 is formed on the top side 47 of the holding area 30; in the present example the mounting rail assumes the shape of a top hat rail. It should be pointed out that the integral mounting rail 50 may have a top hat rail contour like that of DIN EN 60715. Integral fastening means 60, 61, 62 and 63 are provided on the holding area 30 and may extend over the entire length of the support 10. The mounting rail 50 also extends over the entire length of the support 10. Side parts 70 and 75 may be attached to the support by means of the fastening means 60 to 63 as illustrated in FIGS. 3 and 4. In the present example, the holding area 20 is connected to the side wall 40 of the holding area 30. The holding area 20 contains an essentially planar lower surface 21, which begins at the lower section of the side wall 40 of the holding area 30 and preferably runs parallel to the bottom side 48. A wall part 22, which preferably runs parallel to the side wall 40 of the holding area 30, is integrally molded on the outer end of the lower surface 21. Two grooves 80, 81 are formed at a distance from one another in the upper area of the wall part 22, so they are open toward the side wall 40. Two protrusions which define a groove 90 are provided flush with the groove 80 on the side wall 40 of the holding area 30. The grooves 80, 81 and 90 advantageously extend over the entire length of the support 10. A circuit board 100 can be loosely inserted into the grooves 80 and 90. A web 110 running parallel to the side wall 40 and extending perpendicularly upward from the bottom part 21 may lie between the outer wall part 22 and the parallel side wall 40. This web 110 has an integral groove 120, which is arranged so that it is flush with the groove 81 in the wall part 22. The grooves 81 and 120 define an additional holder of the holding area 20 that can hold an additional circuit board 101 loosely. As shown in FIG. 1, the circuit boards 100 and 101 have different dimensions. In the present example, it can be seen that the side wall 40 can also be interpreted as a dividing line between the first holding area 20 and the second holding area 30. Usually in practice, only one of the circuit boards 100 and 101 is inserted into the support 10. A reinforcing area 115, which ensures good stability and vibration strength of the support 10, may run between the web 110 and the side wall 40.

The wall part 22 has a protrusion 130 which is arranged so that it is flush with a protrusion 131 on the web 110. The lower surface 21 of the holding area 20 has supporting profiles 140, 141 and 142 which form an accommodating area or holding area for an insulating board 150 together with the lower edges of the protrusions 130 and 131. An insulating board 150 is arranged beneath the circuit boards 100 and 101 and prevents the circuit boards from coming into electric contact with the bottom part 21 of the holding area 20.

It should be emphasized that the extruded profile shown in FIG. 1 represents only one exemplary embodiment. It is important only that the integral mounting rail 50 and the circuit board 100 and/or the circuit board 101 are arranged so they are spatially separate from one another, namely in such a way that a mounting rail module case placed on the top hat rail 50 can be released from the integral mounting rail 50 by pivoting it in the direction of the circuit board 100 or 101. The circuit board 100 or 101 is expediently arranged beneath the top hat rail 50.

The first holding area 20, for example, has fastening means 64 and 65 to which the side parts 70 and 75 can be attached detachably in the area of the lower surface 21, for example.

It is also conceivable that the grooves 80 and 90, for example, may be arranged so they are offset in height in relation to one another, so that the circuit board 100 can be kept at a predetermined angle to the lower surface 21.

Figure 2A:
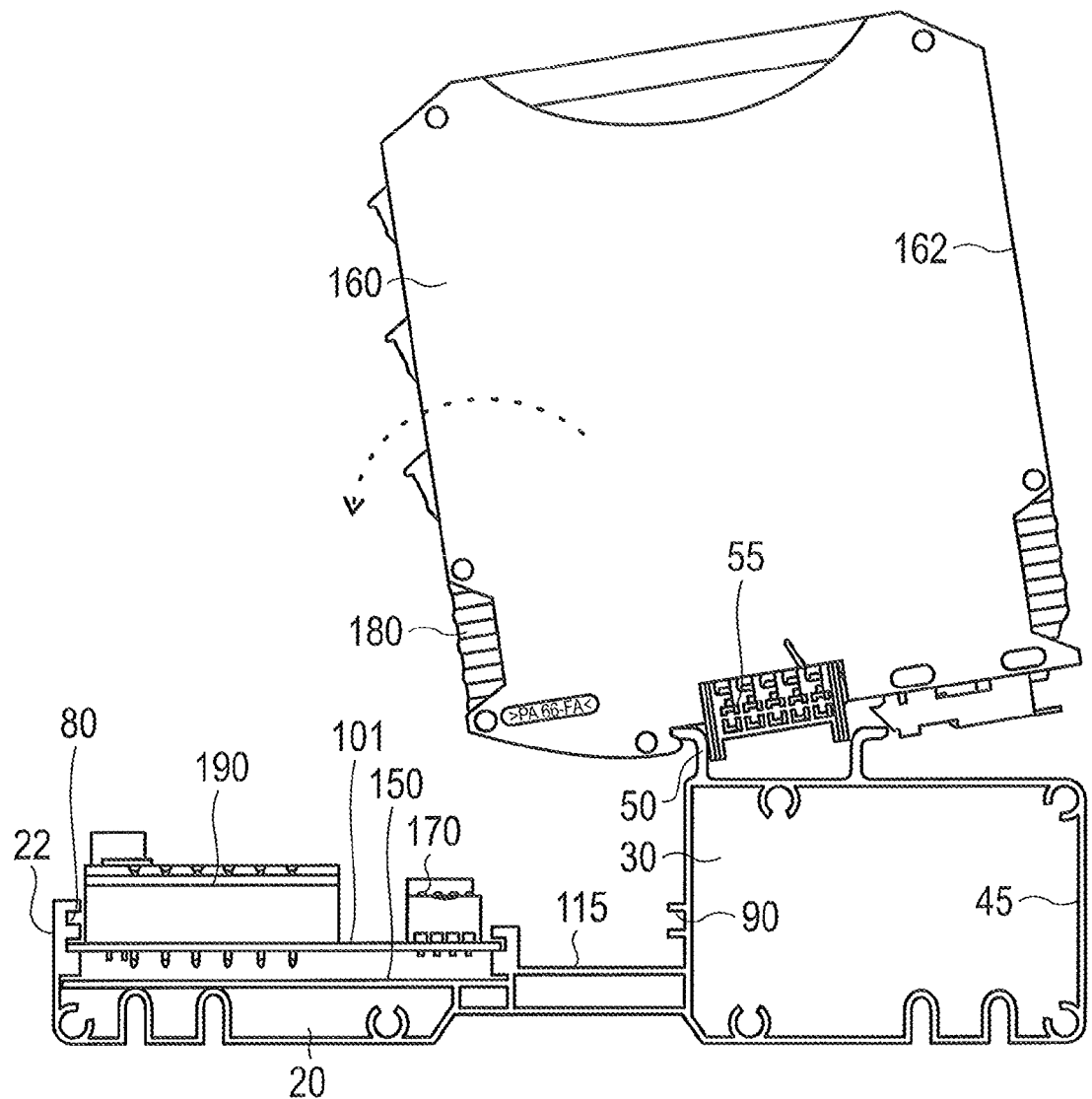
FIG. 2a shows the mounting rail module case in a position to be released from the integral mounting rail.

FIG. 2 shows the one-piece support 10 according to FIG. 1. A T-bus connector 55 is inserted detachably into the integral mounting rail 50. Mounting rail module cases 160 and/or their electronic and/or optoelectronic component can accommodate a power supply and/or can communicate with one another by means of the T-bus connector 55. Error messages can be transmitted in this way, for example.

Multiple mounting rail module cases 160, which may differ in design and in particular in width, may be mounted on the top hat rail 50. Based on the side view, only one mounting rail module case 160 can be seen. It should be noted that the rear side 162 of the mounting rail module case may be flush with the exterior wall 45 of the support 10. This makes it possible to install the assembled one-piece support 10 in a control cabinet in a space-saving manner. The circuit board 101 which is held loosely by the grooves 81 and 120 is inserted into the holding area 20. The insulating board 150 is arranged between the lower surface 21 and the circuit board 101. The circuit board 101 is designed as a jumper card and has at least one plug connector strip 170. The plug connector strip 170 may extend over the entire length of the support 10. Contacts 180 are provided on the front side of the mounting rail module case 60, for example, and may be manually connected to corresponding connection contacts of the plug connector strip 170 by prefabricated cables. This wiring is not shown in FIG. 2. Additional electronic and/or optoelectronic components 190 may be mounted on the circuit board 101.

As FIG. 2 shows the mounting rail module case 160 may be pivoted in the direction of the circuit board 101 for releasing it from the mounting rail 50. First one must only remove the cables from the contacts 180 and/or from the plug connector strip 170. Thanks to the special spatial arrangement of the top hat rail 50 and circuit board, i.e., the special spatial separation between the first holding area 20 and the second holding area 30 as well as the manual wiring of the mounting rail module case 160, different mounting rail module cases with different widths and different arrangements of the contacts 180 may be attached to the one-piece support 10. In addition, the contour of the holding area 20 ensures that the circuit board 101 and/or 100 can be kept mechanically protected. As shown by FIG. 2, the insulating board 150 prevents contact pins of the circuit board 101 from being able to enter into electric contact with the support 10.

FIG. 3 shows the accommodating device 5, which has a modular design containing the one-piece support 10 shown in FIG. 1 as an example. In addition, the side part 70 and/or the side part 75 is/are detachably connected to each broad side of the support 10. The side parts 70 and 75 may be secured by means of screws, for example, which are screwed into the fastening contours 60 to 65 of the support 10, each side part 70 and 75 preferably being designed in approximately mirror image to one another and having fastening means 200 for mounting on an external mounting rail. In the present example, the fastening means 200 are designed so that the accommodating device 5 may be mounted on an external top hat rail (not shown). The contours of the first holding area 20 and the two side parts 70 and 75 ensure that the circuit board 100 or 101 is inserted and that the insulating board 150 is held on their complete circumference on all four sides without requiring separate fastening means such as screws or the like.

The external top hat rail may in turn be arranged in a control cabinet. The fastening means 200 may comprise an adjusting screw 201 in combination with a claw by means of which the accommodating device 5 can be secured on the external top hat rail (not shown here). In addition, each side part 70 and 75 has contours into which a cover 210, hereinafter also referred to as a partition, can be inserted.

These contours serve as a guide and holder for the partition 210. The partition 210 preferably stands perpendicular to the lower surface 21 of the holding area 20. It preferably sits in front of the plug connector strip 170, so that the wiring (not shown) and the mounting rail module cases 160 behind it are not visible to the personnel.

For the purpose of a spatial orientation, it should be pointed out that the holding area 30 is facing the wall of a control cabinet for example, while the holding area 20 is accessible to the customer or the operating personnel. In other words the operating personnel see only the electronic components 190 shown in FIG. 2 and FIG. 4. In addition to the electronic components 190, other connectors and/or connector strips 195 may also be arranged on the circuit board 101.

FIG. 4 shows the folding device 5 from FIG. 3, shown here after a 180° rotation. This means that the holding area 20 of the support 10 is now on the right side.

The modular type of design of the accommodating device 5 allows the operating personnel to quickly replace a defective circuit board, for example, without any great effort. To do so, it is not even necessary to remove the module case 160 from the top hat rail 50. Instead it is sufficient to disconnect the wiring between the plug connector strip 170 and the contacts 180 of the mounting rail module cases 160. Next the defective circuit board can be removed from the holder area 20. The partition 210 and one of the side walls 70 or 75 must also be removed if necessary.

To be able to remove mounting rail module cases 160, one need only pull the partition 210 away from the side parts 70 and 75 and disconnect the cable connections between the plug connector strip 170 and the contacts 180 of the module case 160. The module case can then be detached by simply pivoting the corresponding module case in the direction of the circuit board 101. This special pivoting is made possible by the fact that the integral top hat rail 50 and the holding area 20 are spatially separate from one another, so that even in the installed state, the module case 160 and the circuit board 100 or 101 are mechanically decoupled.

To permit direct installation without a top hat rail, for example, the extruded profile may have grooves on the bottom side to allow the use of screw connections to mounting boards, for example.

What is claimed is:

1. A device for accommodating mounting rail module cases, which contain components that are to be contacted electrically, the device comprising:
   a one-piece support constructed with:
   (i) a first holding area, wherein the first holding area is physically adapted to loosely hold at least one circuit board, and
   (ii) a second holding area, wherein the second holding area is constructed with an integral mounting rail that is adapted to physically engage and hold at least one mounting rail module case;
   wherein the first holding area and the second holding area are arranged at a distance from one another; and
   wherein the arrangement enables the at least one mounting rail module case to pivot in the direction of the circuit board, so as to release the at least one mounting rail module case from the integral mounting rail.

2. The device according to claim 1, wherein the one-piece support is an extruded profile of a predeterminable length.

3. The device according to claim 1, wherein the circuit board has connecting contacts for manual wiring to the at least one mounting rail module case.

4. The device according to claim 1, wherein a side part can be detachably attached to each broad side of the support, wherein each side part has a holder by means of which the device can be mounted on a mounting rail.

5. The device according to claim 4, wherein the side parts extend over the entire width of the support.

6. The device according to claim 4, wherein the one-piece support has integrals fastening contours for detachable attachment of the side parts.

7. The device according to claim 1, wherein the first holding area is designed for loosely holding circuit boards of different dimensions.

8. The device according to claim 1, wherein the first holding area is designed for releasably securing an insulating board.

9. The device according to claim 1, wherein the first holding area has mutually aligned accommodating areas for loosely holding opposing longitudinal sides of a circuit board.

10. The device according to claim 9, wherein the accommodating areas comprise grooves.

11. The device according to claim 1, further comprising a detachable partition separating at least one section of the first holding area from the second holding area.

12. The device according to claim 11, wherein the side parts are designed for guiding and holding the detachable partition.

13. The device according to claim 1, wherein the integral mounting rail is in the form of a top hat rail.

14. The device according to claim 1, wherein the circuit board is a jumper card.

15. The device according to claim 1, further comprising a T-bus connector which can be inserted loosely into the integral mounting rail for electrical connection to the at least one mounting rail module case.

* * * * *